(12) United States Patent
Shi et al.

(10) Patent No.: US 10,735,029 B2
(45) Date of Patent: Aug. 4, 2020

(54) METHOD AND APPARATUS FOR ENCODING PACKETS USING VIDEO DATA REDUNDANCY CONTROL INFORMATION

(71) Applicant: TENCENT TECHNOLOGY (SHENZHEN) COMPANY LIMITED, Shenzhen (CN)

(72) Inventors: Yongfang Shi, Shenzhen (CN); Anlin Gao, Shenzhen (CN); Jing Lv, Shenzhen (CN); Jingchang Chen, Shenzhen (CN); Jian He, Shenzhen (CN); Chenchen Gu, Shenzhen (CN); Xunan Mao, Shenzhen (CN); Haibo Deng, Shenzhen (CN); Licai Guo, Shenzhen (CN); Chao Dai, Shenzhen (CN); Xun Zhang, Shenzhen (CN)

(73) Assignee: TENCENT TECHNOLOGY (SHENZHEN) COMPANY LIMITED, Shenzhen (CN)

(\*) Notice: Subject to any disclaimer, the term of this patent is extended or adjusted under 35 U.S.C. 154(b) by 104 days.

(21) Appl. No.: 15/955,315

(22) Filed: Apr. 17, 2018

(65) Prior Publication Data
US 2018/0234116 A1    Aug. 16, 2018

Related U.S. Application Data

(63) Continuation of application No. PCT/CN2017/075859, filed on Mar. 7, 2017.

(30) Foreign Application Priority Data

Mar. 11, 2016    (CN) .......................... 2016 1 0140656

(51) Int. Cl.
*H03M 13/00* (2006.01)
*H04L 1/00* (2006.01)
(Continued)

(52) U.S. Cl.
CPC ....... *H03M 13/353* (2013.01); *H03M 13/356* (2013.01); *H04L 1/0007* (2013.01);
(Continued)

(58) Field of Classification Search
None
See application file for complete search history.

(56) References Cited

U.S. PATENT DOCUMENTS

| | | | |
|---|---|---|---|
| 8,347,199 | B2 | 1/2013 | Lawson et al. |
| 8,935,580 | B2 | 1/2015 | Bims |

(Continued)

FOREIGN PATENT DOCUMENTS

| | | | |
|---|---|---|---|
| CN | 102006625 | A | 4/2011 |
| CN | 102036061 | A | 4/2011 |

(Continued)

OTHER PUBLICATIONS

X. Zhang, X. Peng, S. Fowler and D. Wu, "Robust H.264/AVC Video Transmission using Data Partitioning and Unequal Loss Protection," 2010 10th IEEE International Conference on Computer and Information Technology, Bradford, 2010, pp. 2471-2477. doi: 10.1109/CIT.2010.423.*

(Continued)

*Primary Examiner* — Justin R Knapp
(74) *Attorney, Agent, or Firm* — Oblon, McClelland, Maier & Neustadt, L.L.P.

(57) ABSTRACT

The application discloses video data redundancy control methods and apparatuses. Video packet redundancy control information is determined according to packet loss at a reception apparatus. The video packet redundancy control information is received from the reception apparatus. Video data is encoded according to the video packet redundancy control information to obtain encoded video data of a plurality of frames by a transmission apparatus. A frame- (Continued)

level redundancy budget is allocated for one of the plurality of frames according to the video packet redundancy control information. Further, the one of the plurality of frames is packetized according to the frame-level redundancy budget to generate a packetized frame. Redundancy coding is performed on the packetized frame to generate video packets including data packets and redundant packets for transmission to the reception apparatus.

14 Claims, 5 Drawing Sheets

(51) Int. Cl.
  *H04N 19/00* (2014.01)
  *H03M 13/35* (2006.01)
  *H04N 7/14* (2006.01)
  *H04N 21/637* (2011.01)
  *H04N 19/46* (2014.01)
  *H04N 21/238* (2011.01)
  *H04N 19/67* (2014.01)
  *H04L 29/06* (2006.01)
  *H04N 7/24* (2011.01)
  *H04N 21/6375* (2011.01)
  *H04N 19/172* (2014.01)
  *H04N 19/115* (2014.01)
  *H04N 19/166* (2014.01)
  *H04N 19/169* (2014.01)
  *H03M 13/15* (2006.01)

(52) U.S. Cl.
  CPC ............ *H04L 1/007* (2013.01); *H04L 1/0009* (2013.01); *H04L 1/0014* (2013.01); *H04L 1/0041* (2013.01); *H04L 65/601* (2013.01); *H04N 7/14* (2013.01); *H04N 7/147* (2013.01); *H04N 7/24* (2013.01); *H04N 19/00* (2013.01); *H04N 19/46* (2014.11); *H04N 19/67* (2014.11); *H04N 21/238* (2013.01); *H04N 21/637* (2013.01); *H03M 13/152* (2013.01); *H03M 13/1515* (2013.01); *H04L 1/0057* (2013.01); *H04L 65/608* (2013.01); *H04L 65/80* (2013.01); *H04N 19/115* (2014.11); *H04N 19/166* (2014.11); *H04N 19/172* (2014.11); *H04N 19/188* (2014.11); *H04N 21/6375* (2013.01)

(56) References Cited

U.S. PATENT DOCUMENTS

| | | | |
|---|---|---|---|
| 9,215,498 B2 | 12/2015 | Liu et al. | |
| 9,246,630 B2 | 1/2016 | Dui | |
| 10,506,257 B2* | 12/2019 | Gu | .................. H04N 19/166 |
| 2003/0056168 A1* | 3/2003 | Krishnamachari | ... H03M 13/00 |
| | | | 714/774 |
| 2003/0067981 A1 | 4/2003 | Zhao et al. | |
| 2004/0233844 A1 | 11/2004 | Yu et al. | |
| 2005/0160346 A1 | 7/2005 | Yamane | |
| 2010/0002692 A1 | 1/2010 | Bims | |
| 2010/0079575 A1* | 4/2010 | Ali | .................. H04N 7/148 |
| | | | 348/14.13 |
| 2010/0185919 A1 | 7/2010 | Lawson et al. | |
| 2010/0185926 A1 | 7/2010 | Lawson et al. | |
| 2012/0290900 A1* | 11/2012 | Paniconi | ............ H03M 13/353 |
| | | | 714/776 |
| 2014/0286440 A1* | 9/2014 | Apte | ................... H04L 1/0017 |
| | | | 375/240.27 |
| 2015/0169396 A1 | 6/2015 | Tsyganok | |
| 2015/0341812 A1* | 11/2015 | Dion | ................... H04W 24/08 |
| | | | 370/252 |
| 2017/0094297 A1* | 3/2017 | Gu | .................. H04N 19/172 |

FOREIGN PATENT DOCUMENTS

| | | |
|---|---|---|
| CN | 102065289 A | 5/2011 |
| CN | 102075312 A | 5/2011 |
| CN | 102143367 A | 8/2011 |
| CN | 102438152 A | 5/2012 |
| JP | 2001-016584 | 1/2001 |
| JP | 2003-179580 | 6/2003 |
| JP | 2004-215201 | 7/2004 |
| JP | 2005-175837 | 6/2005 |
| JP | 2007-511188 | 4/2007 |
| JP | 2009-278521 | 11/2009 |
| JP | 2010-041326 | 2/2010 |
| JP | 2012-015871 | 1/2012 |
| JP | 2014-003512 | 1/2014 |

OTHER PUBLICATIONS

International Search Report dated Jun. 9, 2017 in PCT/CN2017/075859 with English translation, 7 pages.
PCT International Preliminary Search Report dated Sep. 11, 2018 in PCT/CN2017/075859—4 pages.
PCT Written Opinion of the International Searching Authority dated Jun. 9, 2017 in PCT/CN2017/075859—9 pages.
Chinese Office Action dated Apr. 30, 2019 in Chinese Patent Application No. 201610140656.2 with English concise explanation of relevance—6 pages.
Japanese Office Action dated Jul. 1, 2019 in Japanese Patent Application No. 2018-523752 with Summary in English—8 pages.
Office Action dated Mar. 22, 2019 in Korean Patent Application No. 10-2018-7012368, with machine English translation.

* cited by examiner

METHOD AND APPARATUS FOR ENCODING PACKETS USING VIDEO DATA REDUNDANCY CONTROL INFORMATION

RELATED APPLICATION

This application is a continuation of International Application No. PCT/CN2017/075859, filed on Mar. 7, 2017, which claims priority to Chinese Patent Application No. 201610140656.2, entitled "VIDEO DATA REDUNDANCY CONTROL METHOD AND APPARATUS" filed with the Chinese Patent Office on Mar. 11, 2016. The entire disclosures of the prior applications are hereby incorporated by reference in their entirety.

FIELD OF THE TECHNOLOGY

The present disclosure relates to the field of video data transmission technologies, and specifically to a video data redundancy control method and apparatus.

BACKGROUND OF THE DISCLOSURE

Best-Effort is a standard Internet service model. For a Best-Effort data network service, a packet loss during transmission can occur.

In the field of video call technologies, based on characteristics of video data, a differential pulse code modulation (DPCM) coding architecture is generally used in a current mainstream video compression and coding standard. Whether a frame of the video data can be successfully decoded can depend not only on data integrity of the frame, but also on whether a reference frame is decoded. In such a coding architecture, an I frame (also referred to as an intra-frame coding frame) can be independently decoded without reference to any frame, a P frame (also referred to as an inter-frame coding frame or a forward predictive coding frame) can be successfully decoded in combination with a respective reference frame. Therefore, the importance of a frame of video data varies.

In the related technology, video data or video packet redundancy control schemes empirically provide more protection on the I frame and front frames within an I frame intra-period, but in these schemes, redundancy protection on a frame is insufficiently refined, and does not scale well to different code stream structures.

SUMMARY

Embodiments of the present disclosure provide video data redundancy control methods and apparatuses, so as to implement refined redundancy protection on each frame of video data, thereby improving the transmission performance of the video data.

Aspects of the disclosure provide a method for video data redundancy control. Video packet redundancy control information is received, by interface circuitry of a transmission apparatus, from a reception apparatus. The video packet redundancy control information is determined according to packet loss at the reception apparatus. Video data is encoded, by processing circuitry of the transmission apparatus, according to the video packet redundancy control information to obtain encoded video data of a plurality of frames. A frame-level redundancy budget is allocated for one of the plurality of frames according to the video packet redundancy control information. The one of the plurality of frames is packetized according to the frame-level redundancy budget to generate a packetized frame. Redundancy coding is performed on the packetized frame to generate video packets including data packets and redundant packets for transmission to the reception apparatus.

Aspects of the disclosure provide a method for video data redundancy control. First video packets are received, by interface circuitry of a reception apparatus, from a transmission apparatus. Packet loss is determined, by processing circuitry of the reception apparatus, based on the received first video packets. Video packet redundancy control information is determined for the transmission apparatus based on the packet loss. The video packet redundancy control information is transmitted to the transmission apparatus to enable the transmission apparatus to implement frame-level video packet redundancy control. Second video packets that are generated according to the frame-level video packet redundancy control are received from the transmission apparatus.

Aspects of the disclosure provide a transmission apparatus for video data redundancy control. The transmission apparatus includes interface circuitry and processing circuitry. The interface circuitry receives video packet redundancy control information. The video packet redundancy control information is determined according to packet loss at a reception apparatus. The processing circuitry encodes video data according to the video packet redundancy control information to obtain encoded video data of a plurality of frames. The processing circuitry allocates a frame-level redundancy budget for one of the plurality of frames according to the video packet redundancy control information. The processing circuitry packetizes the one of the plurality of frames according to the frame-level redundancy budget to generate a packetized frame, and performs redundancy coding on the packetized frame to generate video packets including data packets and redundant packets for transmission to the reception apparatus. Further, the interface circuitry transmits the video packets to the reception apparatus.

Aspects of the disclosure provide a reception apparatus for video data redundancy control. The reception apparatus includes interface circuitry and processing circuitry. The interface circuitry receives first video packets from a transmission apparatus. The processing circuitry determines packet loss based on the received first video packets, and determines video packet redundancy control information for the transmission apparatus based on the packet loss. The interface circuitry transmits the video packet redundancy control information to the transmission apparatus to enable the transmission apparatus to implement frame-level video packet redundancy control, and receives second video packets that are generated according to the frame-level video packets redundancy control from the transmission apparatus.

Aspects of the disclosure provide a non-transitory computer-readable storage medium storing a program executable by a processor to determine video packet redundancy control information according to packet loss at a reception apparatus. The video packet redundancy control information is received from the reception apparatus. Video data is encoded according to the video packet redundancy control information to obtain encoded video data of a plurality of frames. A frame-level redundancy budget is allocated for one of the plurality of frames according to the video packet redundancy control information. Further, the one of the plurality of frames is packetized according to the frame-level redundancy budget to generate a packetized frame. Redundancy coding is performed on the packetized frame to generate video packets including data packets and redundant packets for transmission to the reception apparatus.

It can be learned from the foregoing that in some feasible implementations of the present disclosure, the receiving end feeds back the video bit rate and the redundancy level; and the sending end performs compressing and coding according to the video bit rate, to obtain the compressed video data; obtaining a data redundancy rate according to the redundancy level; allocates a frame-level redundancy bit rate budget for a frame of the compressed video data according to the video bit rate and the data redundancy rate; and packetizes, according to an intra-period level redundancy bit rate budget and the frame-level redundancy bit rate budget, the frame of the compressed video data, and performs redundancy coding on a packetized packet. Therefore, the redundancy control on the video data is refined to each frame, and importance of each frame may be reflected, so that redundancy control refinement of the video data is improved, thereby facilitating reducing the packet loss rate, improving the transmission performance of the video data, and facilitating improving the scalability of a code stream structure, so as to be applicable to a plurality of coding structures.

BRIEF DESCRIPTION OF THE DRAWINGS

To describe the technical solutions in the embodiments of the present disclosure more clearly, the following briefly introduces the accompanying drawings required for describing the embodiments and the related technology. The accompanying drawings in the following description show merely some embodiments of the present disclosure, and a person of ordinary skill in the art may still derive other drawings from these accompanying drawings.

DESCRIPTION OF EMBODIMENTS

To make a person skilled in the art understand the solutions in the present disclosure better, the following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure shall fall within the protection scope of the present disclosure.

As described in the background, for a Best-Effort data network service, a packet loss during transmission is inevitable. In a video call application, to improve the transmission performance, a redundancy coding control method is generally used to add a redundancy error correction packet in video data to recover a possible packet loss. For example, in a Voice over Internet Protocol (VoIP) application, to reduce a time delay, the User Datagram Protocol (UDP) protocol is generally used. To protect quality of service (QoS), generally, a possible packet loss is recovered in a manner of adding a redundancy error correction packet.

A method for adding a redundancy error correction packet in the video data may be as follows: First, each frame of the video data is packetized, so that data of each frame is divided into p data packets. Then, q redundancy error correction packets are added for the frame by using a particular redundancy coding algorithm, such as forward error correction (FEC) coding, Reed-Solomon (RS) coding, and Bose, Ray-Chaudhuri, and Hocquenghem (BCH) coding. Finally, the data packets and the redundancy correction packets of the frame are transmitted to a receiving end. By means of the method, packet losses of q data packets may be concealed. When a packet is lost, the lost data packet may be recovered by using a redundancy error correction packet, where q and p are both positive integers. Note that the packet loss concealment capability is determined according to the number of added redundancy error correction packets. For a frame that is important, relatively more redundancy error correction packets may be added to provide more protection.

In an embodiment, a DPCM coding architecture is generally used in a current mainstream video compression and coding standard. In this architecture, a frame of video data is classified into, for example, two types including a type 1 frame and a type 2 frame. In an example, one type, or the type 1 frame, can be an I frame. The I frame is an intra-frame coding frame and is independently compressed and coded without reference to another frame. In an example, the other type, or the type 2 frame, can be a P frame. The P frame is an inter-frame coding frame, and reference needs to be made to a respective reference frame, for example, an I frame before the P frame, another P frame before the P frame. Compression and coding are performed for differential data obtained by comparing the P frame and the respective reference frame. Therefore, the I frames may be independently coded or decoded, and reference the reference frame of the P frame is used for coding and decoding of the P frame. Therefore, the I frame and the P frame are different in importance. In addition, importance of different P frames may also vary. For example, assuming that a frame n is the I frame, the frame n is a reference frame for a frame n+1 and a frame n+2, and the frame n+2 is a reference frame for a frame n+3, if decoding of the frame n+2 fails, the frame n+3 cannot be decoded. It can be learned that the frame n+1 and the frame n+2 that are both P frames are different in importance.

Figure 1:
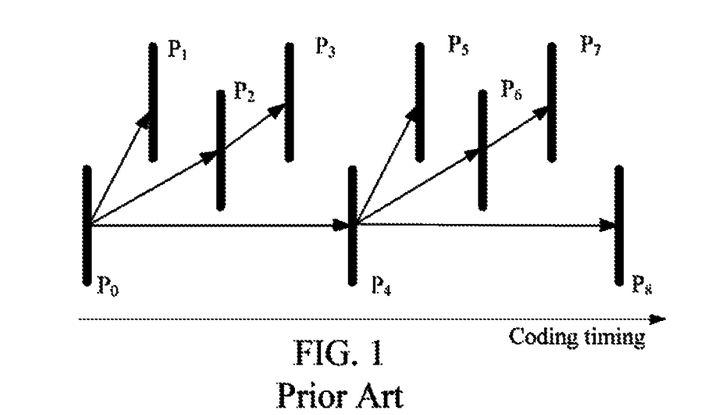
FIG. 1 is a schematic diagram of an HPP coding structure.

In another coding structure, the importance of frames may also vary. Referring to a hierarchical P-frame prediction (HPP) coding structure shown in FIG. 1, a hierarchical prediction manner is used in the HPP. Frames at different time layers are different in importance. As shown in FIG. 1, the importance of frames (P0, P4, and P8) at a Layer0 is higher than the importance of frames (P2 and P6) at a Layer1, and the importance of frames (P2 and P6) at a Layer1 is higher than the importance of frames (P1, P3, P5, P7) at a Layer2.

However, in a current video data redundancy control scheme, although an unequal error protection (UEC) policy is also used to perform special protection on some important frames, but more protection is empirically provided on an I frame and front frames within an I frame intra-period. Redundancy protection cannot be respectively performed in accordance with different importance of frames, and importance of each frame cannot be quantitatively quantized; or refined frame-level redundancy protection cannot be implemented. As a result, the scalability to different code stream structures is not strong.

In addition, in terms of a video packetizing method, in the related technology, packet sending is performed based on the size of a maximum transmission unit (MTU), to reduce a packetized packet quantity, thereby saving header overheads. In the packetizing method in the related technology, a large packet approximate to the size of the MTU is sent as much as possible, and the packet may be discarded by a packet queuing policy of a route when a network is congested, resulting in insufficient packet loss concealment capability; and consequently, the transmission performance is reduced.

Based on the foregoing problems, to improve the packet loss concealment capability and improve the transmission performance of video data, embodiments of the present disclosure provide a video data redundancy control method and a corresponding apparatus.

Detailed descriptions are respectively provided below by using specific embodiments.

Figure 2:
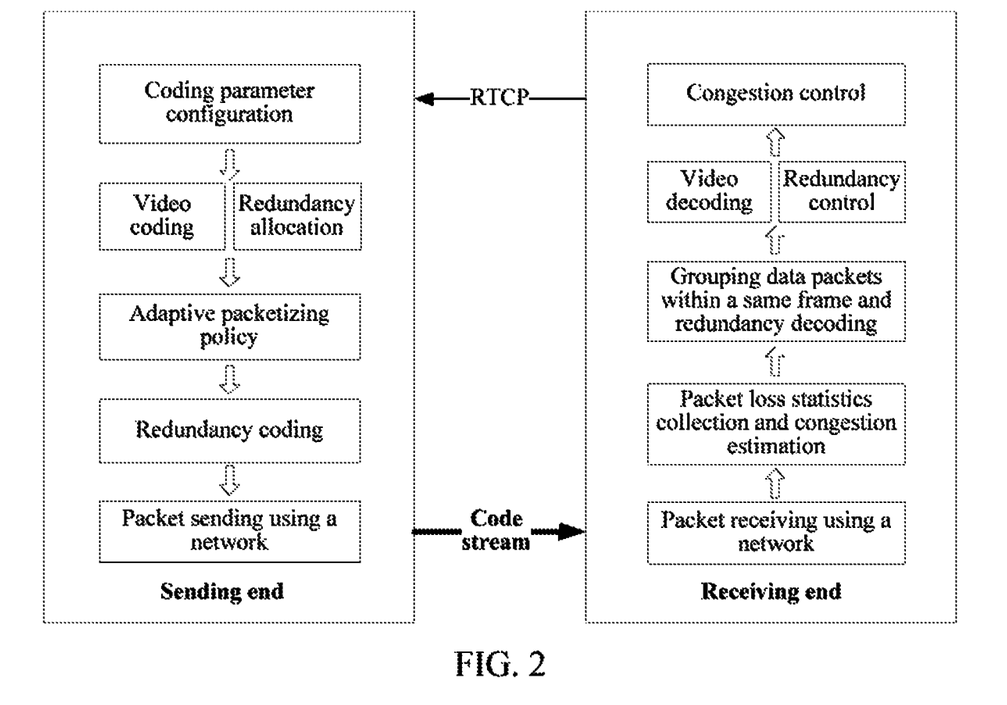
FIG. 2 is a system architectural diagram of a redundancy control system according to an embodiment of the present disclosure.

FIG. 2 is a system architectural diagram of a redundancy control system according to an embodiment of the present disclosure. The redundancy control system includes a sending end and a receiving end. The sending end or the receiving end may be deployed on a terminal device such as a personal computer or a mobile communications terminal such as a smartphone and a tablet computer.

As shown in FIG. 2, in the redundancy control system in this embodiment of the present disclosure, a working procedure of the sending end may include: configuring coding parameter including configuring a coding parameter such as a video bit rate; video coding including compressing and coding video data according to the configured coding parameter; redundancy allocation including allocating a redundancy rate for a frame of compressed video data obtained by means of the video coding; an adaptive packetizing policy including determining a packetizing solution of each frame, for example, a frame of data is classified into how much data packets; redundancy coding including adding a redundancy error correction packet for each frame by performing redundancy coding using an error correction method such as FEC; and network transmission including sending the data packet of the video data and an added redundancy error correction packet to the receiving end by using a network.

A working procedure of a receiving end may include: packet receiving using a network including receiving data, including the data packet of the video data and the redundancy error correction packet, sent by the sending end; packet loss statistics calculation including collecting statistics for a packet loss rate, to estimate a congestion status; grouping data packets within a same frame and redundancy decoding including decoding by grouping data packets and redundancy error correction packets of a same frame into one group, and when a packet lost, recovering the lost data packet by using the redundancy error correction packet, to obtain compressed video data of each frame; video decoding including performing video decoding on the obtained compressed video data, to obtain original video data; redundancy control including determining a redundancy ratio according to a decoding status, for example, determining, according to the packet loss rate, a data redundancy rate for concealing the packet loss rate, to instruct the sending end to perform appropriate redundancy control; congestion control including determining, according to a bandwidth status, a video bit rate can be used at the sending end, and feeding back the data redundancy rate and video bit rate back to the sending end. After receiving the data redundancy rate and the video bit rate, the sending end is configured to configure a coding parameter according to the data redundancy rate and the video bit rate.

Figure 3:
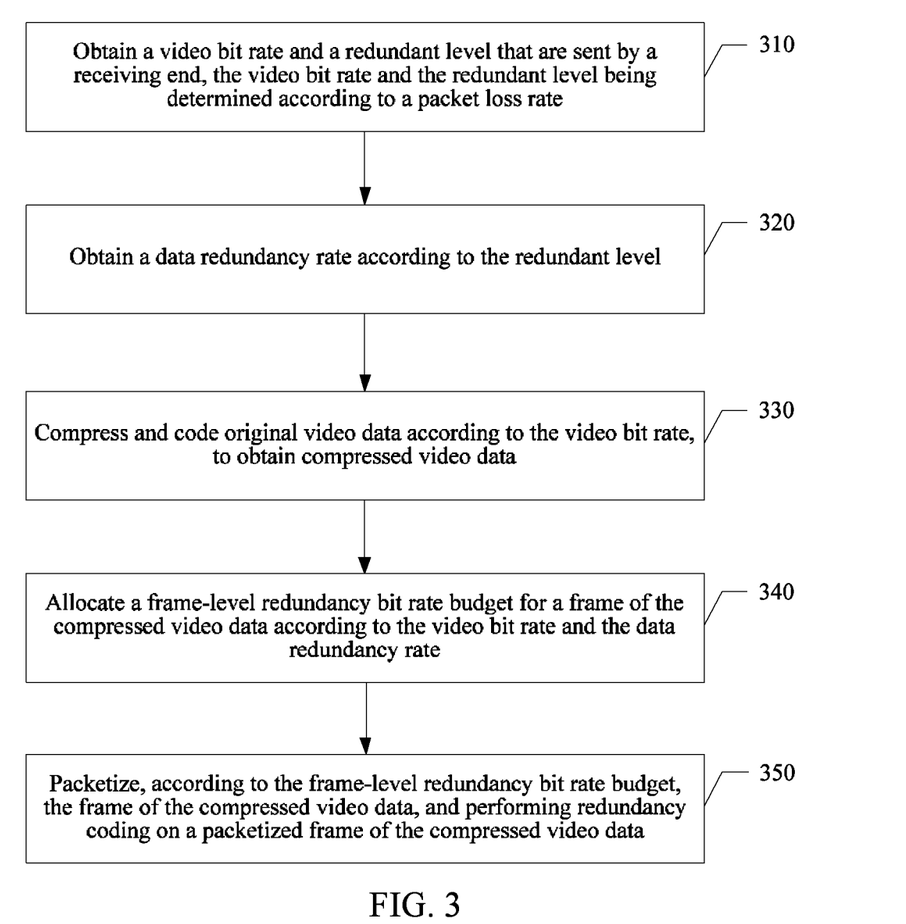
FIG. 3 is a schematic flowchart of a video data redundancy control method according to an embodiment of the present disclosure.

Referring to FIG. 3, an embodiment of the present disclosure provides a video data redundancy control method. The method is applied to a sending end of a redundancy control system. The method may include the following steps:

In step 310, obtain a video bit rate and a redundant level sent by a receiving end, the video bit rate and the redundant level being determined by the receiving end according to a packet loss rate.

In an embodiment, video packet redundancy control information including the video bit rate and the redundant level can be obtained based on a packet loss. In an example, the packet loss can be calculated using a packet loss rate.

In step 320, obtain a data redundancy rate according to the redundant level.

Optionally, the receiving end and the sending end may respectively store a same redundancy level table. After receiving the redundancy level, the sending end may obtain, by querying the redundancy level table, the data redundancy rate corresponding to the redundancy level. The redundancy level table is used to store a correspondence between the redundancy level and the data redundancy rate.

In step 330, compress and code original video data according to the video bit rate, to obtain compressed video data.

Optionally, the sending end may compress and code the original video data according to the video bit rate by using a DPCM coding scheme, to obtain the compressed video data. The compressed video data may include different types of frames such as a type 1 frame (e.g., an I frame) and a type 2 frame (e.g., a P frame). The quantity of frames between two neighbouring type 1 frames (e.g., I frames) may be referred to as a frame set (e.g., an I frame intra-period or intra-period). In an embodiment, the I frame intra-period may include one I frame and a plurality of P frames.

In step 340, allocate a frame-level redundancy budget (e.g., a frame-level redundancy bit rate budget) for a frame of the compressed video data according to the video bit rate and the data redundancy rate.

In this step, first, a frame set level redundancy bit rate budget (e.g., an intra-period level redundancy bit rate budget) may be allocated for each I frame intra-period of the compressed video data according to the video bit rate and the data redundancy rate; then different weights may be allocated for frames according to importance of frames within the I frame intra-period, and the frame-level redundancy bit rate budget may be respectively allocated to each frame of the I frame intra-period in combination with the allocated weight and the intra-period level redundancy bit rate budget of the I frame intra-period.

In some implementations, the importance of a frame may be defined to be the quantity of frames that cannot be decoded subsequently within a same intra-period and that is caused because the frame fails to be decoded. Assuming that the quantity of frames that cannot be decoded subsequently is $C_i$ when an $i^{th}$ frame within an intra-period fails to be decoded, a weight may be allocated for the frame according to $C_i$. The allocated weight of the $i^{th}$ frame is $\eta_i = C_i/\Sigma C_i$, where $\Sigma C_i$ is a sum of all $C_i$ within the intra-period.

In some implementations, $BR_r$ is marked as the video bit rate, r is marked as the data redundancy rate, and $BR_r$ is marked as the intra-period level redundancy bit rate budget, the intra-period level redundancy bit rate budget may be calculated and allocated by using a formula $$BR_r = BR_v * \frac{r}{1-r}.$$

In some implementations, $\eta_i$ is marked as the weight of the $i^{th}$ frame within the I frame intra-period, and $R_i$ is marked as the frame-level redundancy bit rate budget of the $i^{th}$ frame, the frame-level redundancy bit rate budget may be calculated and allocated by using a formula $R_i = \eta_i * BR_r$.

In some implementations, to ensure that a key frame meets a redundancy requirement and the total bit rate does not exceed a security sending bit rate $BR_s$, a frame-level redundancy rate may be corrected. Using the $i^{th}$ frame as an example, the frame-level redundancy bit rate budget $R_i$ of the $i^{th}$ frame may be corrected by using a coding size $S_i$ of the $i^{th}$ frame, to limit $R_i$ within an interval $[\alpha*S_i, \beta*S_i]$, where $\alpha$ and $\beta$ are a first and a second redundancy coefficient, and value ranges of $\alpha$ and $\beta$ are [0, 1].

In step 350, packetize, according to the frame-level redundancy bit rate budget, the frame of the compressed video data, and performing redundancy coding on a packetized frame of the compressed video data.

In this embodiment of the present disclosure, after a frame of the compressed video data is packetized, redundancy coding may be performed on the frame of the compressed video data by using a coding method such as FEC coding, RS coding, or BCH coding. Different quantities of redundancy error correction packets are respectively added for different frames according to the allocated frame-level redundancy bit rate budget, so as to implement frame-level refined redundancy protection.

In the packetizing method in the related technology, a large packet approximate to the size of an MTU is sent as much as possible, and the packet may be discarded by a packet queuing policy of a route when a network is congested, resulting in insufficient packet loss concealment capability In some embodiments of the present disclosure, a target packetizing parameter of the frame of the compressed video data may be calculated according to a data redundancy rate requirement, and packetizing is performed according to the target packetizing parameter, so as to adaptively adjust the size of a packetized packet. Therefore, a solution having the strongest packet loss concealment with a limited redundancy bit rate budget is selected.

Using the $i^{th}$ frame as an example, a procedure of calculating the target packetizing parameter may include:

determining a group (e.g., a range) of a packetized packet quantity of the $i^{th}$ frame of the compressed video data, where i is a positive integer;

traversing any packetized packet quantity $N_j$ within the range; calculating a packetized packet size $L_j$ corresponding to the packetized packet quantity $N_j$ and a redundant packet quantity $M_j$; and calculating a packet-level redundancy rate $r_p$ and an excess budget deviation $\Delta$ (or a budget exceeded deviation $\Delta$) according to the packetized packet quantity $N_j$, where $$r_p = \frac{M_j}{M_j + N_j}, \Delta = (N_j + M_j) * L_j - (S_i + R_i),$$

$S_i$ is the coding size of the $i^{th}$ frame, and $R_i$ is the frame-level redundancy bit rate budget of the $i^{th}$ frame; and determining, when the packet-level redundancy rate $r_p$ is the maximum and the budget exceeded deviation $\Delta$ is the minimum, that the packetized packet quantity, the packetized packet size, and the redundant packet quantity are target packetizing parameters.

In the foregoing description, with reference to FIG. 3, the video data redundancy control method is described by using the sending end as an execution body. In the method, the receiving end feeds back the video bit rate and the redundancy level; and the sending end performs compression and coding according to the video bit rate, to obtain the compressed video data; obtains the data redundancy rate according to the redundancy level; allocates the intra-period level redundancy bit rate budget for the I frame intra-period of the compressed video data according to the video bit rate and the data redundancy rate; allocates the frame-level redundancy bit rate budget for the frame within the I frame intra-period; and performs packetizing and redundancy coding on the compressed video data according to the intra-period level redundancy bit rate budget and the frame-level redundancy bit rate budget. Therefore, redundancy control on the I frame intra-period and the frame are implemented, redundancy control on the video data is refined to each frame, and importance of each frame may be reflected, so that redundancy control refinement of the video data is improved, thereby facilitating reducing the packet loss rate, improving the transmission performance of the video data, and facilitating improving the scalability of a code stream structure, so as to be applicable to a plurality of coding structures.

In the following, an embodiment method of the present disclosure is continued to be described by using the receiving end as an execution body.

Figure 4:
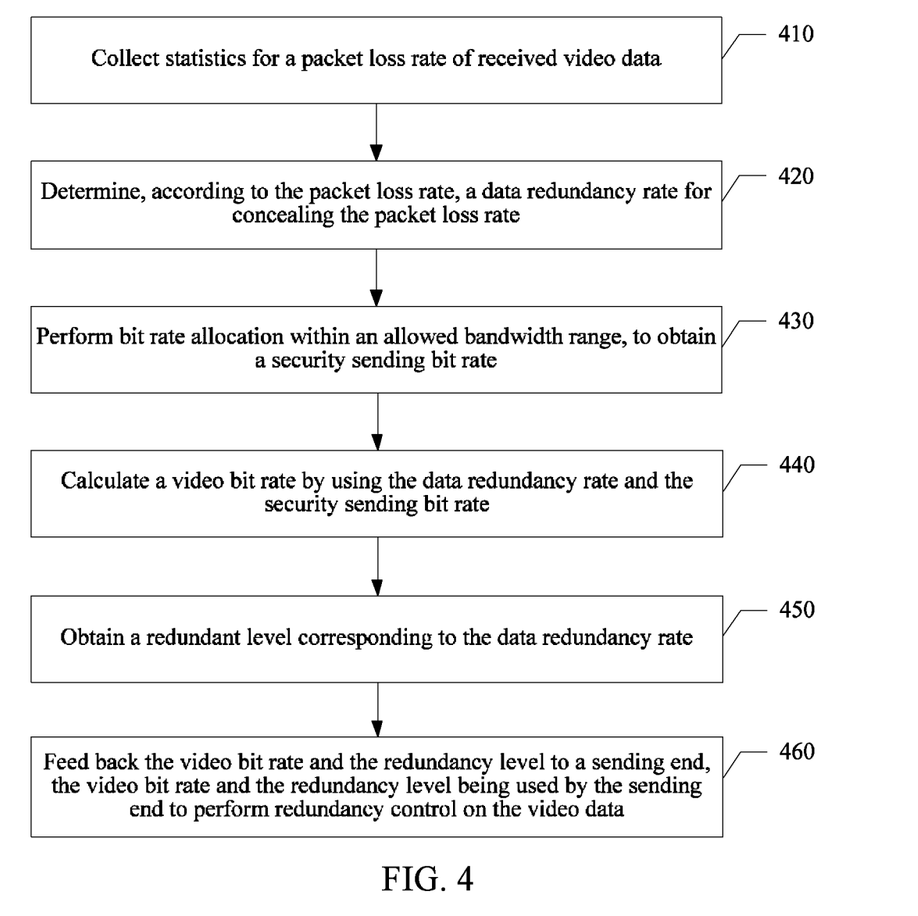
FIG. 4 is a schematic flowchart of a video data redundancy control method according to another embodiment of the present disclosure.

Referring to FIG. 4, an embodiment of the present disclosure further provides a video data redundancy control method. The method is applied to a receiving end of a redundancy control system. The method may include the following steps:

In step 410, collect statistics for a packet loss rate of received video data.

In a process of receiving a data packet of the video data that is sent by a sending end, the receiving end may collect statistics for the packet loss rate. Herein, l is used to indicate the packet loss rate.

In step 420, determine a data redundancy rate according to the packet loss rate.

In some embodiments, the data redundancy rate may be determined by using a formula $r = k*l$, where l is the packet loss rate, k is a coefficient not greater than 3 and not less than 1, and r is the data redundancy rate. In an example, r may be limited to be less than 1.

In step 430, perform bit rate allocation according to a bandwidth range, to obtain a security sending bit rate (or a bit rate for secure transmission).

In an example, the security sending bit rate is less than or equal to an available bandwidth.

In step 440, calculate a video bit rate by using the data redundancy rate and the security sending bit rate.

In some embodiments, the video bit rate may be calculated by using a formula $BR_v = BR_s*(1-r)$, where $BR_s$ is the security sending bit rate, and $BR_v$ is the video bit rate.

In step 450, obtain a redundant level corresponding to the data redundancy rate.

Optionally, the receiving end and the sending end may respectively store a same redundancy level table. The receiving end may obtain, by querying the redundancy level table, a redundancy level RS Level corresponding to the data redundancy rate r. The redundancy level table is used to store a correspondence between the redundancy level and the data redundancy rate.

In step 460, send back the video bit rate and the redundancy level to the sending end, the video bit rate and the redundancy level being used by the sending end to perform redundancy control on the video data.

Optionally, the receiving end may feed back $BR_v$ and RSLevel to the sending end by using the Real-Time Transport Control Protocol (RTCP) protocol.

In the foregoing description, with reference to FIG. 4, the embodiment method of the present disclosure is described by using the receiving end as an execution body. In the method, the receiving terminal determines, by collecting statistics for the packet loss rate, the video bit rate and the data redundancy rate, and the redundancy level corresponding to the data redundancy rate; and feeds back the data redundancy rate and the redundancy level to the sending end, so that the sending end is used to perform frame-level redundancy control on the video data. Therefore, redundancy control refinement of the video data is improved, thereby facilitating reducing the packet loss rate, improving the transmission performance of the video data, and facilitating improving the scalability of the code stream structure, so as to be applicable to a plurality of coding structures.

For ease of better understanding the technical solutions provided in the embodiments of the present disclosure, descriptions are provided below by using an implementation in a specific scenario as an example.

Another video data redundancy control method according to an embodiment of the present disclosure may include the following steps:

In step S1, a sending end performs redundancy coding.

In this embodiment of the present disclosure, for a packet loss concealment redundancy coding, a particular error correction coding method having a capability of recovering a quantity of packet losses may be used, for example, FEC coding, RS coding, and BCH coding. A frame of video data obtained after compression and coding may be divided into N(N≥1) data packets, which are respectively P1, PN, and M redundancy data packets, respectively R1, ... RM, are added by using the foregoing particular redundancy coding algorithm, so that a code group {P1 ... PN, R1 ... RM} may conceal packet losses within M, that is, a packet loss rate does not exceed $$\frac{M}{M+N}.$$

In step S2, configure a redundancy level table.

To reduce the quantity of feedback data, the sending end and a receiving end may store an agreed redundancy level table. In the table, each redundancy level indexes a data redundancy rate r, to conceal a respective network packet loss rate l.

In step S3, a receiving end determines a data redundancy rate.

In a process of packet receiving by the receiving end, the packet loss rate/may be obtained by means of statistics collection. In a redundancy control system, the data redundancy rate r that sufficiently conceals the packet loss rate may be determined according to a policy. The policy may be a conservative policy such as r=l, or a guaranteed policy such as r=k*l (k>1). In actual use, in consideration of balance between a network bandwidth capability limit and the packet loss concealment capability, 1≤k≤3 may be stipulated.

In step S4, the receiving end performs RTCP feedback.

After the data redundancy rate r is obtained, the receiving end performs bit rate allocation within an allowed bandwidth range by using a traffic congestion control function. Assuming that a security sending bit rate obtained by using the congestion control function is $BR_s$ ($BR_s$<=A, where A is an estimated available bandwidth), a pure video bit rate is $BR_v=BR_s*(1-r)$. In addition, the redundancy level RSLevel corresponding to the data redundancy rate r is found in the redundancy level table, and $BR_v$ and RSLevel are fed back to the sending end by using the RTCP protocol.

In step S5, the sending end performs video coding and allocates a redundancy budget for an intra-period level video.

The sending end receives the RTCP feedback, and may perform compression and coding by using $BR_v$ and a set of related parameters assorting with $BR_v$. In this specification, assuming that the size of a frame obtained after coding an $i^{th}$ frame within an intra-period is $S_i$. In addition, the sending end may index an expected data redundancy rate r by using RSLevel carried in the RTCP, and a redundancy code bit budget of the intra-period is calculated by using the following formula:

$$BR_r = BR_v * \frac{r}{1-r}$$

Due to a difference between reference relationships between frames, the importance of the frames within the intra-period varies, so that unequal error protection needs to be performed in combination with the importance of the frame. The importance of an I frame is higher than that of a P frame. In an IPPP reference structure, the importance of a former frame is higher than the importance of a latter frame in a group of pictures (GOP). In addition, in different coding structures, the importance of the frames varies. For example, in the HPP reference structure, the importance of a frame at a lower layer is higher than that of a frame at a higher layer, and at a lowest layer, a frame at the front in a intra-period is more important than a frame at the back. To quantize the importance of the frame, a weight of the $i^{th}$ frame is defined to be $\eta_i$, where $\eta_i$ is a normalized value.

The weight may be an empirical value, or may be calculated according to an algorithm. For example, the importance of a frame may be defined to be the quantity of frames that cannot be decoded subsequently within a same intra-period and that is caused because the frame fails to be decoded.

According to the foregoing defined weight, it may be obtained that an expected redundancy bit rate allocated to the $i^{th}$ frame is $R_i=\eta_i*BR_r$.

In addition, a video scenario may change, so that an actual coding bit rate may not be equal to the expected bit rate $BR_v$. Therefore, the redundancy rate may be corrected according to an actual coding size, so as to ensure that key frames, such as the I frame and a frame at a layer0 in the HPP, meet a redundancy requirement and the total bit rate does not exceed the security sending bit rate $BR_s$.

Specifically, using the $i^{th}$ frame as an example, $R_i$ may be limited within an interval $[\alpha*S_i, \beta*S_i]$, where $\alpha$ and $\beta$ are the first and second redundancy coefficient, and value ranges are [0, 1], that is, $R_i = MAX(MIN(R_i, \beta*S_i), \alpha*S_i)$.

In step S6, perform frame-level adaptive adjustment on the size of a packetized packet.

Generally, the size of a network packet does not exceed a MTU; and in consideration of the transmission efficiency and impact on the video data, the size of a video packet is not too small. Generally, the minimum empirical value $L_{min}$ exists. By means of a redundancy control function of the sending end, the size of the packetized packet can be adaptively adjusted according to a coding size of a current frame and a current redundancy bit rate budget. An overall goal is:

(1) redundancy controllable: accurately adding redundancy according to a proportion; and (2) improving the packet loss concealment capability within the redundancy budget.

After a redundancy budget $R_i$ is obtained, a packetizing manner is determined in combination with an actual coding size Si of the frame.

An algorithm procedure is as follows:

The maximum quantity of video frames and the minimum quantity of video frames $[N_{max}, N_{min}]$ are determined according to a packetized packet size range $[L_{min}, L_{max}]$, where $$N_{min} = ceil\left(\frac{S_i}{L_{max}}\right), N_{max} = floor\left(\frac{S_i}{L_{min}}\right),$$

ceil is rounding up, and floor is rounding down.

The quantity $N_j \in [N_{min}, N_{max}]$ of all packetized packets is traversed, the size $$L_j = ceil\left(\frac{S_j}{N_j}\right)$$

of the corresponding packetized packet is calculated, and the quantity $$M_j = floor\left((1+\gamma)*\frac{R_j}{L_j}\right)$$

of corresponding redundant packets is obtained, where $\gamma$ is an elastic coefficient. It is mainly considered that if a decimal portion is relatively large, the redundancy rate is reduced when being rounded down. In this case, if the intra-period level redundancy budget is sufficient, a redundancy budget exceeding the present frame within an elasticity range is allowed.

A packet-level redundancy rate $r_p$ and an actual budget exceeded deviation $\Delta$ for each packetizing solution are calculated:

$$r_p = \frac{M_j}{M_j + N_j}$$

$$\Delta = (N_j + M_j)*L_j - (S_i + R_i)$$

A solution in which $r_p$ is the maximum is found in all the packetizing manners, that is, a solution in which the packet loss concealment is the strongest, and target packetizing parameters $\{N^*, L^*, M^*\}$ are obtained. If the maximum packet-level redundancy rate $r_p$ corresponds to a plurality of packetizing solutions, the solution in which $\Delta$ is the minimum is used.

It can be learned from the above that this embodiment method of the present disclosure may be applied to video data transmission such as a video call. At an intra-period level, a redundancy rate may be allocated according to the importance of each frame, and adaptive packetizing parameter adjustment may be performed according to the size of an actual video frame obtained after compression and coding is performed and a redundancy bit rate budget, to reach the maximum packet loss concealment capability.

In the redundancy control system according to this embodiment of the present disclosure, the receiving end reasonably determines a redundancy ratio according to a packet loss status, to be capable of concealing network packet losses at some degree. A redundancy bit rate budget is obtained in combination with network bandwidth estimation. In the redundancy control system, redundancy bit rate budget allocation is performed by using I frame intra-period level overall control and frame-level adaptive adjustment. In terms of all frames within an intra-period of a video, the system provides, according to the importance of each frame, frame-level redundancy protection at a corresponding level on data obtained after compression and coding, to improve the capability of recovering the entire intra-period. In addition, to improve the packet loss concealment capability of a single frame to a greatest extent within the redundancy budget, in this embodiment of the present disclosure, an target packetizing parameter is searched for by using adaptive adjustment, to reach the maximum "packet-level" redundancy rate.

To better implement the foregoing solutions in the embodiments of the present disclosure, the following further provides related apparatuses configured to cooperate to implement the foregoing solutions.

Figure 5:
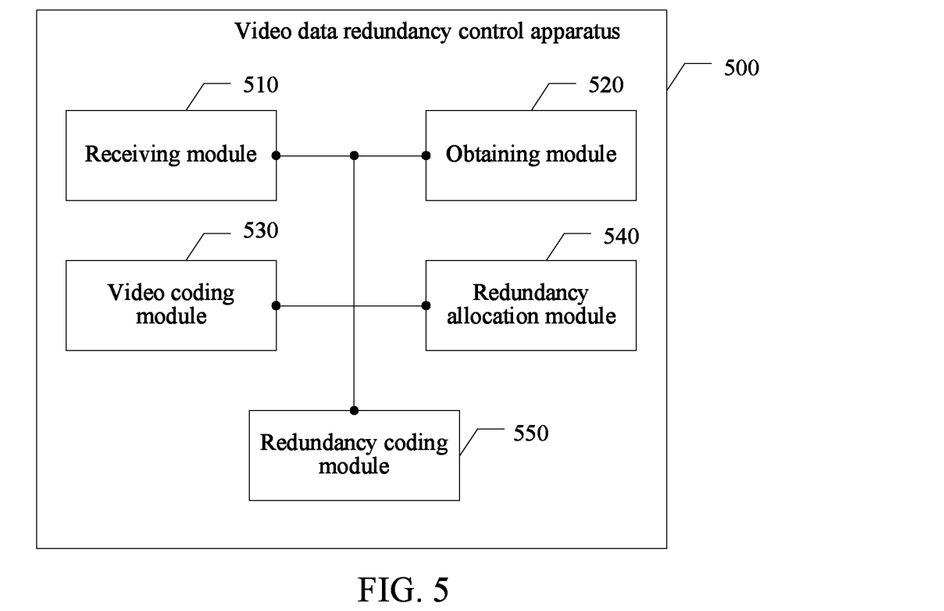
FIG. 5 is a schematic structural diagram of a video data redundancy control apparatus according to an embodiment of the present disclosure.

Referring to FIG. 5, an embodiment of the present disclosure provides a video data redundancy control apparatus 500. The apparatus may be used at a sending end of a redundancy control system. The apparatus may include:

a receiving module 510, configured to obtain a video bit rate and a redundancy level that are sent by a receiving end, the video bit rate and the redundancy level being determined according to a packet loss rate;

an obtaining module 520, configured to obtain a data redundancy rate according to the redundancy level;

a video coding module 530, configured to compress and code original video data according to the video bit rate, to obtain compressed video data;

a redundancy allocation module 540, configured to allocate a frame-level redundancy bit rate budget for a frame of the compressed video data according to the video bit rate and the data redundancy rate; and a redundancy coding module 550, configured to: packetize, according to the frame-level redundancy bit rate budget, the frame of the compressed video data, and perform redundancy coding on a packetized frame of the compressed video data.

In some embodiments of the present disclosure, the obtaining module 520 is specifically configured to obtain, by querying a redundancy level table, the data redundancy rate corresponding to the redundancy level, the redundancy level table being used to store a correspondence between the redundancy level and the data redundancy rate.

In some embodiments of the present disclosure, the redundancy allocation module 540 is further configured to: allocate an intra-period level redundancy bit rate budget for an I frame intra-period of the compressed video data according to the video bit rate and the data redundancy rate; and allocate the frame-level redundancy bit rate budget for a frame within the I frame intra-period according to the intra-period level redundancy bit rate budget.

In some embodiments of the present disclosure, the redundancy allocation module 540 is specifically configured to allocate the intra-period level redundancy bit rate budget for the I frame intra-period of the compressed video data by using the following formula:

$$BR_r = BR_v * \frac{r}{1-r},$$

where $BR_v$ is the video bit rate, r is the data redundancy rate, and $BR_r$ is the intra-period level redundancy bit rate budget.

In some embodiments of the present disclosure, the redundancy allocation module 540 is specifically configured to:

allocate the frame-level redundancy bit rate budget for the frame within the I frame intra-period by using the following formula:

$$R_i = \eta_i * BR_r.$$

$\eta_i$ is a weight of an $i^{th}$ frame within the I frame intra-period, $R_i$ is the frame-level redundancy bit rate budget of the $i^{th}$ frame, i being a positive integer.

In some embodiments of the present disclosure, the redundancy allocation module 540 is further configured to:

correct the frame-level redundancy bit rate budget $R_i$ of the $i^{th}$ frame by using a coding size $S_i$ of the $i^{th}$ frame, to limit $R_i$ within an interval $[\alpha*S_i, \beta*S_i]$, where $\alpha$ and $\beta$ are partial redundancy coefficients, and value ranges of $\alpha$ and $\beta$ are [0, 1].

In some embodiments of the present disclosure, the redundancy coding module 550 is specifically configured to: calculate an target packetizing parameter of the frame of the compressed video data according to the frame-level redundancy bit rate budget; and perform packetizing according to the target packetizing parameter.

In some embodiments of the present disclosure, the redundancy coding module 550 is specifically configured to:

determine a range of a packetized packet quantity of the $i^{th}$ frame of the compressed video data, where i is a positive integer;

traverse any packetized packet quantity $N_j$ within the range; calculate, according to the coding size of the $i^{th}$ frame and the frame-level redundancy bit rate budget, a packetized packet size $L_j$ corresponding to the packetized packet quantity $N_j$ and a redundant packet quantity $M_j$; and calculate a packet-level redundancy rate $r_p$ and a budget exceeded deviation $\Delta$ according to the packetized packet quantity $N_j$, where $$r_p = \frac{M_j}{M_j + N_j},$$

$\Delta = (N_j + M_j) * L_j - (S_i + R_i)$, $S_i$ is the coding size of the $i^{th}$ frame, and $R_i$ is the frame-level redundancy bit rate budget of the $i^{th}$ frame; and determine, when the packet-level redundancy rate $r_p$ is the maximum and the budget exceeded deviation $\Delta$ is the minimum, that the packetized packet quantity, the packetized packet size, and the redundant packet quantity are target packetizing parameters.

It may be understood that functions of functional modules of the apparatus in this embodiment of the present disclosure may be specifically implemented according to the method in the foregoing method embodiment. For a specific implementation process of the apparatus, refer to a related description in the foregoing method embodiment. Details are not described herein again.

In the foregoing description, with reference to FIG. 5, this embodiment of the present disclosure provides a video data redundancy control apparatus used at the sending end. The apparatus may obtain the video bit rate and the redundancy level that are fed back by the receiving end; perform compression and coding according to the video bit rate, to obtain compressed video data; obtain the data redundancy rate according to the redundancy level; allocate an intra-period level redundancy bit rate budget for the I frame intra-period of the compressed video data according to the video bit rate and the data redundancy rate; allocate the frame-level redundancy bit rate budget for the frame within the I frame intra-period; and perform packetizing and redundancy coding on the compressed video data according to the intra-period level redundancy bit rate budget and the frame-level redundancy bit rate budget. Therefore, redundancy control on the I frame intra-period and the frame are implemented, redundancy control on video data is refined to each frame, and importance of each frame may be reflected, so that redundancy control refinement of the video data is improved, thereby facilitating reducing the packet loss rate, improving the transmission performance of the video data, and facilitating improving the scalability of the code stream structure, so as to be applicable to a plurality of coding structures.

Figure 6:
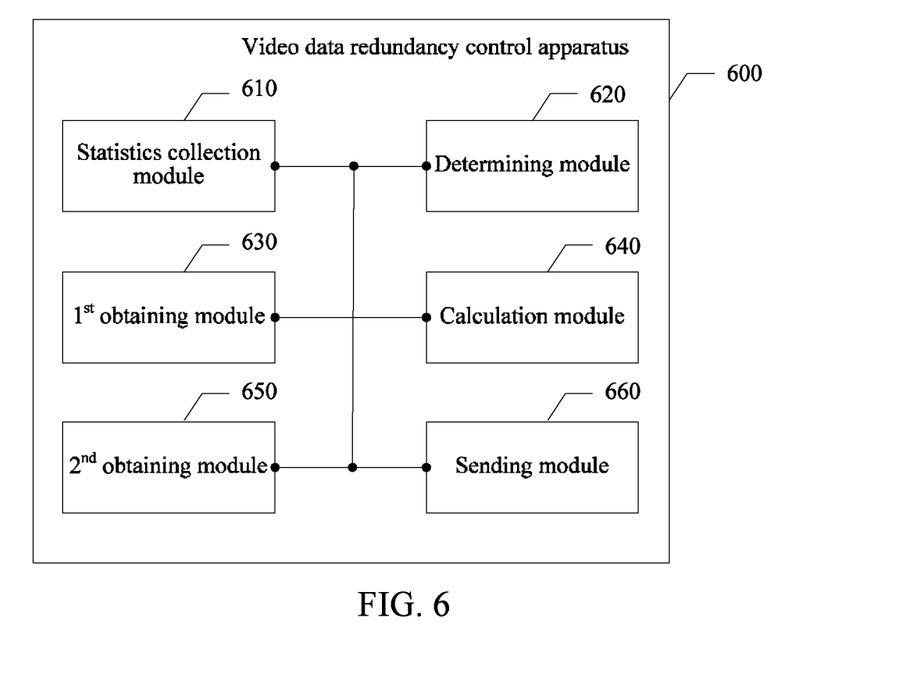
FIG. 6 is a schematic structural diagram of a video data redundancy control apparatus according to another embodiment of the present disclosure.

Referring to FIG. 6, an embodiment of the present disclosure provides a video data redundancy control apparatus 600. The apparatus may be used at a receiving end of a redundancy control system. The apparatus may include:

a statistics collection module 610, configured to collect statistics for a packet loss rate of received video data;

a determining module 620, configured to determine a data redundancy rate according to the packet loss rate;

an obtaining module (or a first obtaining module) 630, configured to perform bit rate allocation according to a bandwidth range, to obtain a security sending bit rate;

a calculation module 640, configured to calculate a video bit rate by using the data redundancy rate and the security sending bit rate;

an obtaining module (or a second obtaining module) 650, configured to obtain a redundancy level corresponding to the data redundancy rate; and a sending module 660, configured to send the video bit rate and the redundancy level to a sending end, the video bit rate and the redundancy level being used by the sending end to perform redundancy control on the video data.

In an embodiment of the present disclosure, the determining module 620 is specifically configured to:

determine the data redundancy rate by using a formula r=k*l, where l is the packet loss rate, k is a coefficient not greater than 3 and not less than 1, r is the data redundancy rate. In an example, r may be limited to be less than 1.

In an embodiment of the present disclosure, the calculation module 640 is specifically configured to:

calculate the video bit rate by using a formula $BR_v=BR_s*(1-r)$, where $BR_s$ is the security sending bit rate, and $BR_v$ is the video bit rate.

It may be understood that functions of functional modules of the apparatus in this embodiment of the present disclosure may be specifically implemented according to the method in the foregoing method embodiment. For a specific implementation process of the apparatus, refer to a related description in the foregoing method embodiment. Details are not described herein again.

In the foregoing description, with reference to FIG. 6, this embodiment of the present disclosure provides a video data redundancy control apparatus used at the receiving end. The apparatus may determine, by collecting statistics for the packet loss rate, the video bit rate and the data redundancy rate, and the redundancy level corresponding to the data redundancy rate; and feed back the data redundancy rate and the redundancy level to the sending end, so that the sending end is used to perform frame-level redundancy control on the video data. Therefore, redundancy control refinement of the video data is improved, thereby facilitating reducing the packet loss rate, improving the transmission performance of the video data, and facilitating improving the scalability of the code stream structure, so as to be applicable to a plurality of coding structures.

An embodiment of the present disclosure further provides a computer storage medium. The computer storage medium may store a program. When being executed, the program performs some or all of the steps of the video data redundancy control method recorded in the method embodiment shown in FIG. 3, or performs some or all of the steps of the video data redundancy control method recorded in the method embodiment shown in FIG. 4. When the program stored in the computer storage medium is executed by a computer device including one or more processors, so that the computer device performs the video data redundancy control method recorded in the method embodiment shown in FIG. 3, or performs the video data redundancy control method recorded in the method embodiment shown in FIG. 4.

Figure 7:
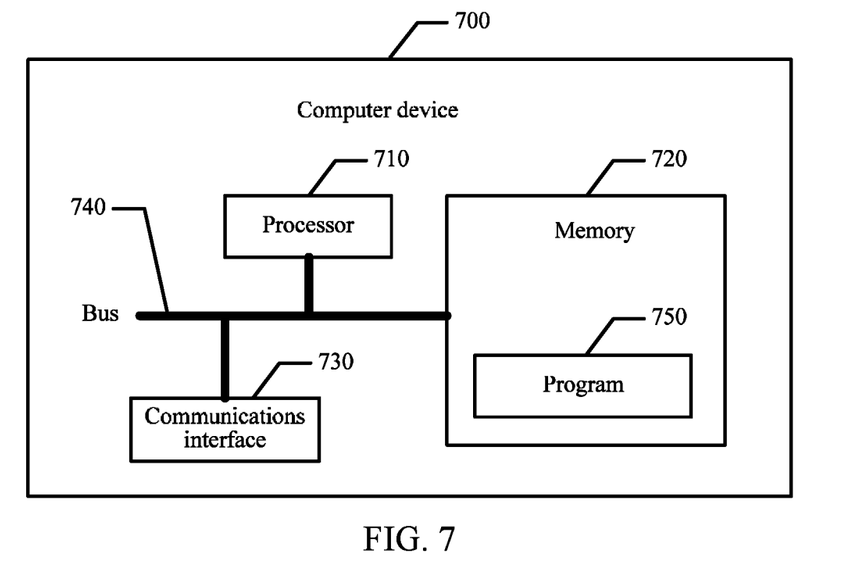
FIG. 7 is a schematic structural diagram of a computer device according to an embodiment of the present disclosure.

Referring to FIG. 7, an embodiment of the present disclosure further provides a computer device 700, including:

a processor 710, a memory 720, a communications interface 730, and a bus 740.

The memory 720 is configured to store a program 750, and the processor 710 is connected to the memory 720 by using the bus 740. When the computer device 700 is running, the processor 710 executes the program 750 stored in the memory 720, so that the computer device 700 performs the video data redundancy control method recorded in the method embodiment shown in FIG. 3.

The communications interface 730 is configured to perform the following step: obtaining a video bit rate and a redundancy level that are fed back by a receiving end, the video bit rate and the redundancy level being calculated by the receiving end according to the packet loss rate.

The processor 710 is configured to perform the following steps: obtaining a data redundancy rate according to the redundancy level; compressing and coding original video data according to the video bit rate, to obtain compressed video data; allocating a frame-level redundancy bit rate budget for a frame of the compressed video data according to the video bit rate and the data redundancy rate; and packetizing, according to the frame-level redundancy bit rate budget, the frame of the compressed video data, and performing redundancy coding on a packetized frame of the compressed video data.

Optionally, the processor 710 is further configured to perform the following step: obtaining, by querying a redundancy level table, the data redundancy rate corresponding to the redundancy level, the redundancy level table being used to store a correspondence between the redundancy level and the data redundancy rate.

Optionally, the processor 710 is further configured to perform the following steps: allocating an intra-period level redundancy bit rate budget for an I frame intra-period of the compressed video data according to the video bit rate and the data redundancy rate; and allocating the frame-level redundancy bit rate budget for a frame within the I frame intra-period according to the intra-period level redundancy bit rate budget.

Optionally, the processor 710 is further configured to perform the following step: allocating the intra-period level redundancy bit rate budget for the I frame intra-period of the compressed video data by using the following formula:

$$BR_r = BR_v * \frac{r}{1-r},$$

where $BR_v$ is the video bit rate, r is the data redundancy rate, and $BR_r$ is the intra-period level redundancy bit rate budget.

Optionally, the processor 710 is further configured to perform the following step:

allocating the frame-level redundancy bit rate budget for the frame within the I frame intra-period by using the following formula:

$$R_i = \eta_i * BR_r, \text{ where}$$

$\eta_i$ is a weight of an $i^{th}$ frame within the I frame intra-period, $R_i$ is the frame-level redundancy bit rate budget of the $i^{th}$ frame, i being a positive integer.

Optionally, the processor 710 is further configured to perform the following step:

correcting the frame-level redundancy bit rate budget $R_i$ of the $i^{th}$ frame by using a coding size $S_i$ of the $i^{th}$ frame, to limit $R_i$ within an interval $[\alpha*S_i, \beta*S_i]$, where $\alpha$ and $\beta$ are the first and second redundancy coefficient, and value ranges of $\alpha$ and $\beta$ are [0, 1].

Optionally, the processor 710 further performs the following steps: calculating an target packetizing parameter of the frame of the compressed video data according to the frame-level redundancy bit rate budget; and performing packetizing according to the target packetizing parameter.

Optionally, the processor 710 is further configured to perform the following steps:

determining a range of a packetized packet quantity of the $i^{th}$ frame of the compressed video data, where i is a positive integer;

traversing any packetized packet quantity N within the range; calculating a packetized packet size $L_j$ corresponding to the packetized packet quantity $N_j$ and a redundant packet quantity $M_j$; and calculating a packet-level redundancy rate $r_p$ and a budget exceeded deviation $\Delta$ according to the packetized packet quantity $N_j$, where $$r_p = \frac{M_j}{M_j + N_j},$$

$\Delta=(N_j+M_j)*L_j-(S_i+R_i)$, $S_i$ is the coding size of the $i^{th}$ frame, and $R_i$ is the frame-level redundancy bit rate budget of the $i^{th}$ frame; and determining, when the packet-level redundancy rate $r_p$ is the maximum and the budget exceeded deviation $\Delta$ is the minimum, that the packetized packet quantity, the packetized packet size, and the redundant packet quantity are target packetizing parameters.

The bus 740 may be an industry standard architecture (ISA) bus, a peripheral component interconnect (PCI) bus, an extended industry standard architecture (EISA) bus, or the like. The bus may be classified into one or more of an address bus, a data bus, and a control bus. For ease of representation, one bold line is used to represent the bus in the figure, but this does not mean that there is only one bus or only one type of bus.

The memory 720 may include a high-speed random access memory (RAM) memory. Optionally, the memory 720 may further include a non-volatile memory. For example, the memory 720 may include a magnetic disk memory.

The processor 710 may be a central processing unit (CPU), or the processor 710 may be an application-specific integrated circuit (ASIC), or the processor 710 may be one or more integrated circuits configured to implement the embodiments of the present disclosure.

It may be understood that, functions of the functional modules of the computer device in this embodiment of the present disclosure may be specifically implemented according to the methods in the foregoing method embodiments. For specific implementation processes, refer to related descriptions in the foregoing method embodiments, and details are not described herein again.

The computer device disclosed in this embodiment of the present disclosure may perform the video data redundancy control method according to the foregoing method embodiments, and obtain the technical effects that the foregoing method embodiments can be obtained.

Figure 8:
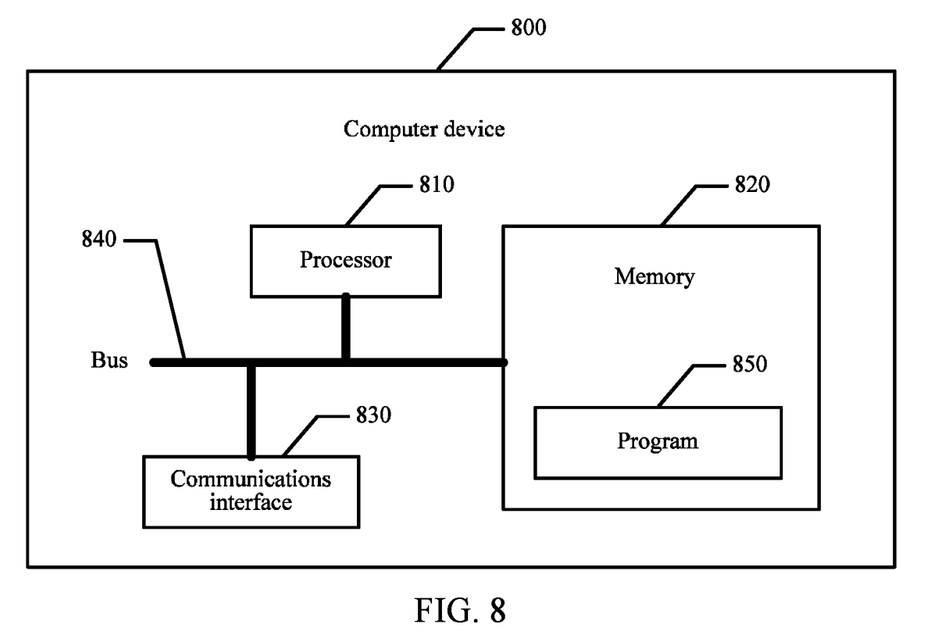
FIG. 8 is a schematic structural diagram of a computer device according to another embodiment of the present disclosure.

Referring to FIG. 8, an embodiment of the present disclosure further provides a computer device 800, including:
a processor 810, a memory 820, a communications interface 830, and a bus 840.

The memory 820 is configured to store a program 850, and the processor 810 is connected to the memory 820 by using the bus 840. When the computer device 800 is running, the processor 810 executes the program 850 stored in the memory 820, so that the computer device 800 performs the video data redundancy control method recorded in the method embodiment shown in FIG. 4.

The processor 810 is configured to perform the following steps: collecting statistics for a packet loss rate of received video data; determining, according to the packet loss rate, a data redundancy rate used for concealing the packet loss rate; performing bit rate allocation within an allowed bandwidth range, to obtain a security sending bit rate; calculating a video bit rate by using the data redundancy rate and the security sending bit rate; and obtaining a redundancy level corresponding to the data redundancy rate.

The communications interface 830 is configured to perform the following steps: sending the video bit rate and the redundancy level to a sending end, the video bit rate and the redundancy level being used by the sending end to perform redundancy control on the video data.

Optionally, the processor 810 is further configured to perform the following step: determining the data redundancy rate by using a formula $r=k*l$, where $l$ is the packet loss rate, k is a coefficient not greater than 3 and not less than 1, and r is the data redundancy rate. In an example, r may be limited to be less than 1.

Optionally, the processor 810 is further configured to perform the following step: calculating the video bit rate by using a formula $BR_v=BR_s*(1-r)$, where $BR_s$ is the security sending bit rate, and $BR_v$ is the video bit rate.

The bus 840 may be an ISA bus, a PCI bus, an EISA bus, or the like. The bus may be classified into one or more of an address bus, a data bus, and a control bus. For ease of representation, one bold line is used to represent the bus in the figure, but this does not mean that there is only one bus or only one type of bus.

The memory 820 may include a high-speed RAM memory. Optionally, the memory 820 may further include a non-volatile memory. For example, the memory 820 may include a magnetic disk memory.

The processor 810 may be a CPU, or the processor 810 may be an ASIC, or the processor 810 may be one or more integrated circuits configured to implement the embodiments of the present disclosure.

It may be understood that, functions of the functional modules of the computer device in this embodiment of the present disclosure may be specifically implemented according to the methods in the foregoing method embodiments. For specific implementation processes, refer to related descriptions in the foregoing method embodiments, and details are not described herein again.

The computer device disclosed in this embodiment of the present disclosure may perform the video data redundancy control method according to the foregoing method embodiments, and obtain the technical effects that the foregoing method embodiments can be obtained.

In the foregoing embodiments, the description of each embodiment has respective focuses. For a part that is not described in detail in an embodiment, refer to related descriptions in other embodiments.

Note that, for ease of description, the foregoing method embodiments are described as a series of action combinations. However, a person skilled in the art should understand that the present disclosure is not limited to the described sequence of the actions, because some steps may be performed in another sequence or performed at the same time according to the present disclosure. In addition, a person skilled in the art should also know that all the embodiments described in this specification are exemplary embodiments, and the related actions and modules are not necessarily required in the present disclosure.

A person of ordinary skill in the art may understand that all or some of the steps of the methods in the embodiments may be implemented by a program instructing relevant hardware. The program may be stored in a computer readable storage medium, such as a non-transitory computer readable storage medium. The storage medium may include a ROM, a RAM, a magnetic disk, or an optical disc.

The video data redundancy control method and apparatus provided in the embodiments of the present disclosure are described above in detail. Although the principles and implementations of the present disclosure are described by using specific embodiments in this specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of this specification should not be construed as a limitation to the present disclosure.

What is claimed is:

1. A method, comprising:
receiving, by interface circuitry of a transmission apparatus, video packet redundancy control information from a reception apparatus, the video packet redundancy control information being determined according to packet loss at the reception apparatus, the video packet control information indicating a redundancy level;
encoding, by processing circuitry of the transmission apparatus, video data according to the video packet redundancy control information to obtain encoded video data of a plurality of frames;
allocating, based on at least the redundancy level, a frame-level redundancy budget for one of the plurality of frames according to the video packet redundancy control information;
packetizing the one of the plurality of frames according to the frame-level redundancy budget to generate a packetized frame; and
performing redundancy coding on the packetized frame to generate video packets including data packets and redundant packets for transmission to the reception apparatus.

2. The method according to claim 1, wherein
the video packet redundancy control information further indicates a video bit rate,
the packet loss is calculated based on a packet loss rate, and
the method further includes:
determining a data redundancy rate according to the redundancy level by using a table that specifies a relationship between the data redundancy rate and the redundancy level.

3. The method according to claim 2, wherein
the plurality of frames of the encoded video data includes a frame set that includes a type 1 frame decoded independently and a type 2 frame decoded based on the type 1 frame in the frame set,
the frame-level redundancy budget is a frame-level redundancy bit rate budget, and
the allocating the frame-level redundancy budget for the one of the plurality of frames includes:
determining a frame set level redundancy bit rate budget for the frame set according to the video bit rate and the data redundancy rate; and
determining the frame-level redundancy bit rate budget according to the frame set level redundancy bit rate budget.

4. The method according to claim 3, wherein the determining the frame set level redundancy bit rate budget for the frame set according to the video bit rate and the data redundancy rate comprises:
determining the frame set level redundancy bit rate budget ($BR_r$) for the frame set according to the video bit rate ($BR_v$) and the data redundancy rate (r) by using the following formula:

$$BR_r = BR_v * \frac{r}{1-r}.$$

5. The method according to claim 4, wherein the determining the frame-level redundancy bit rate budget according to the frame set level redundancy bit rate budget comprises:
determining the frame-level redundancy bit rate budget R according to the frame set level redundancy bit rate budget $BR_r$ and a weight $\eta$ associated with the one of the plurality of frames by using the following formula:

$$R=\eta*BR_r.$$

6. The method according to claim 5, further comprising:
adjusting the frame-level redundancy bit rate budget R to be within an interval $[\alpha*S, \beta*S]$ based on an encoding size S of the one of the plurality of frames, a first redundancy coefficient $\alpha$ within an interval [0,1], and a second redundancy coefficient $\beta$ within an interval [0,1].

7. The method according to claim 1, wherein
the frame-level redundancy budget is a frame-level redundancy bit rate budget; and
the packetizing the one of the plurality of frames according to the frame-level redundancy budget to generate the packetized frame includes:
determining at least one target packetizing parameter to packetize the one of the plurality of frames according to the frame-level redundancy bit rate budget; and
packetizing the one of the plurality of frames according to the at least one target packetizing parameter.

8. The method according to claim 7, wherein the determining the at least one target packetizing parameter to packetize the one of the plurality of frames according to the frame-level redundancy bit rate budget comprises:
dividing the one of the plurality of frames into different numbers of data packets for each group of $N_1, \ldots, N_p$, p being an integer larger than 1;
determining, according to an encoding size S of the one of the plurality of frames and the frame-level redundancy bit rate budget R, packet sizes and numbers of redundant packets of the one of the plurality of frames associated with the numbers of data packets in the respective groups $N_1, \ldots, N_p$;
determining, for the one of the plurality of frames, packet-level redundancy rates and excess budget deviations associated with the numbers of data packets in the respective groups $N_1, \ldots, N_p$, a packet-level redundancy rate $r_{pj}$ and an excess budget deviation $\Delta_j$ being determined by using the following formulas $r_{pj}=M_j/(M_j+N_j)$ and $\Delta_j=(M_j+N_j)*L_j-(S+R)$, $M_j$ being a number of redundant packets $N_j$, and j being a packet size associated with a respective number of data packets $N_j$, and j being an integer greater than or equal to 1 and less than or equal to p; and
choosing the at least one target packetizing parameter that includes a number of data packets that is associated with a maximum packet-level redundancy rate or includes the number of data packets that is associated with the maximum packet-level redundancy rate and a minimum excess budget deviation, the maximum packet-level redundancy rate corresponding to the largest value in the packet-level redundancy rates, and the minimum excess budget deviation corresponding to the smallest value in the excess budget deviations.

9. A transmission apparatus, comprising:
interface circuitry configured to:
receive video packet redundancy control information from a reception apparatus, the video packet redundancy control information being determined according to packet loss at the reception apparatus, the video packet control information indicating a redundancy level; and transmit video packets to the reception apparatus; and processing circuitry configured to:
encode video data according to the video packet redundancy control information to obtain encoded video data of a plurality of frames;
allocate, based on at least the redundancy level, a frame-level redundancy budget for one of the plurality of frames according to the video packet redundancy control information;
packetize the one of the plurality of frames according to the frame-level redundancy budget to generate a packetized frame; and
perform redundancy coding on the packetized frame to generate the video packets including data packets and redundant packets for transmission to the reception apparatus.

10. The transmission apparatus according to claim 9, wherein
the video packet redundancy control information further indicates a video bit rate,
the packet loss is calculated based on a packet loss rate, and
the processing circuitry is further configured to determine a data redundancy rate according to the redundancy level by using a table that specifies a relationship between the data redundancy rate and the redundancy level.

11. The transmission apparatus according to claim 10, wherein
the plurality of frames of the encoded video data includes a frame set that includes a type 1 frame decoded independently and a type 2 frame decoded based on the type 1 frame in the frame set,
the frame-level redundancy budget is a frame-level redundancy bit rate budget, and
the processing circuitry is further configured to:
determine a frame set level redundancy bit rate budget for the frame set according to the video bit rate and the data redundancy rate; and
determine the frame-level redundancy bit rate budget according to the frame set level redundancy bit rate budget.

12. The transmission apparatus according to claim 11, wherein the processing circuitry is further configured to:
determine the frame-level redundancy bit rate budget $R$ according to the frame set level redundancy bit rate budget $BR_r$ and a weight $\eta$ associated with the one of the plurality of frames by using the following formula:

$R=\eta*BR_r$.

13. The transmission apparatus according to claim 9, wherein
the frame-level redundancy budget is a frame-level redundancy bit rate budget; and
the processing circuitry is further configured to:
determine at least one target packetizing parameter to packetize the one of the plurality of frames according to the frame-level redundancy bit rate budget; and
packetize the one of the plurality of frames according to the at least one target packetizing parameter.

14. A non-transitory computer-readable storage medium storing a program executable by a processor to perform:
receiving video packet redundancy control information from a reception apparatus, the video packet redundancy control information being determined according to packet loss at the reception apparatus, the video packet control information indicating a redundancy level;
encoding video data according to the video packet redundancy control information to obtain encoded video data of a plurality of frames;
allocating, based on at least the redundancy level, a frame-level redundancy budget for one of the plurality of frames according to the video packet redundancy control information;
packetizing the one of the plurality of frames according to the frame-level redundancy budget to generate a packetized frame; and
performing redundancy coding on the packetized frame to generate video packets including data packets and redundant packets for transmitting to the reception apparatus.

* * * * *